United States Patent [19]
Brennan et al.

[11] Patent Number: 5,844,523
[45] Date of Patent: Dec. 1, 1998

[54] ELECTRICAL AND ELECTROMAGNETIC APPARATUSES USING LAMINATED STRUCTURES HAVING THERMOPLASTIC ELASTOMERIC AND CONDUCTIVE LAYERS

[75] Inventors: Joan V. Brennan, Woodbury; Scott T. Ginkel, Stillwater; Timothy S. Skogland, Scandia, all of Minn.

[73] Assignee: Minnesota Mining and Manufacturing Company, St. Paul, Minn.

[21] Appl. No.: 609,092

[22] Filed: Feb. 29, 1996

[51] Int. Cl.⁶ .................................................. H01Q 1/38
[52] U.S. Cl. ................... 343/700 MS; 343/846; 174/138 A; 174/153 A
[58] Field of Search ............... 343/700 MS, 846, 343/767, 770; 174/138 A, 149 R, 148, 153 A, 152 A; H01Q 1/38

[56] References Cited

U.S. PATENT DOCUMENTS

| | | | |
|---|---|---|---|
| 3,349,164 | 10/1967 | Wyatt | 174/73 |
| 3,470,127 | 9/1969 | Snell et al. | 260/33.6 |
| 3,876,454 | 4/1975 | Snell et al. | 117/22 P |
| 4,173,019 | 10/1979 | Williams | 343/700 MS |
| 4,363,842 | 12/1982 | Nelson | 428/36 |
| 4,666,742 | 5/1987 | Takakura et al. | 427/229 |
| 4,816,836 | 3/1989 | Lalezari | 29/846 |
| 4,833,005 | 5/1989 | Klaar et al. | 428/224 |
| 4,843,400 | 6/1989 | Tsao et al. | 343/700 MS |
| 4,887,089 | 12/1989 | Shibata et al. | 343/700 MS |
| 4,914,445 | 4/1990 | Shoemaker | 343/700 MS |
| 4,937,585 | 6/1990 | Shoemaker | 343/700 MS |
| 4,963,891 | 10/1990 | Aoyagi et al. | 343/700 |
| 4,975,329 | 12/1990 | Bothe et al. | 428/461 |
| 5,070,340 | 12/1991 | Diaz | 343/767 |
| 5,124,713 | 6/1992 | Mayes et al. | 343/700 MS |
| 5,363,114 | 11/1994 | Shoemaker | 343/828 |
| 5,440,651 | 8/1995 | Martin | 382/156 |
| 5,526,006 | 6/1996 | Akahane et al. | 343/866 |
| 5,621,571 | 4/1997 | Bantli et al. | 343/700 MS |

FOREIGN PATENT DOCUMENTS

| | | | |
|---|---|---|---|
| 5-83022 | 4/1993 | Japan | H01Q 1/42 |
| 5-311010 | 11/1993 | Japan . | |
| 1050462A | 4/1991 | Switzerland . | |
| WO 95/32528 | 11/1995 | WIPO | H01Q 9/04 |

OTHER PUBLICATIONS

Brydson, J., "Relation of Stucture to Chemical Properties," *Plastic Materials,* 5th ed., p. 100 (Mid–County Press, London, 1989).

Brochure, Cowperthwait, J., "Properties of Thermoplastic Olefins (TPOs) as Compared with Thermoplastic Elastomers (TPEs) Based on Ethylene Propylene Rubbers," pp. 1–8, Montell Incorporated.

Brochure, Cowperthwait, J., "Reactor–made TPOs: A New Class of Materials Creating New Market Opportunites," pp. 1–12, Montell Incorporated.

Holden, G., "Elestomers, Synthetic–Styrene–Styrene–Butadiene Ruber," *Elastomers, Synthetic (Thermoplastic),* vol. 9, pp. 15–37.

Ivan, G., "Elastomeric Polyolefin Processing," pp. 943–966.

Legge, N., "Thermoplastic Elastomers—The Future," *Elastomerics,* pp. 19–24, (Oct. 1985).

Pozar et al., "Design Considerations for Low Sidelobe Micostrip Arrays," *IEEE Trans. on Antennas and Propagation,* vol. 38, No. 8, pp. 1176–1186 (Aug. 1990).

(List continued on next page.)

*Primary Examiner*—Hoanganh T. Le
*Attorney, Agent, or Firm*—H. Sanders Gwin, Jr.

[57] ABSTRACT

Electromagnetic and electrical apparatuses use a laminate structure having a thermoplastic elastomer with variable dielectric loss as a dielectric layer. A conductive layer laminated to the thermoplastic elastomer allow use for applications such as printed circuit boards and slot antennas. Additional conductive and dielectric layers still allow use as a printed circuit board as well as other antenna structures. Some embodiments of the apparatuses disclosed exhibit many desired properties, such as flexibility, conformability and weatherability.

24 Claims, 7 Drawing Sheets

OTHER PUBLICATIONS

Pozar et al., "Microstrip Antennas—The Analysis and Design of Microstrip Antennas and Arrays," *IEEE Antennas and Propagation,* pp. 1–7 (reprint, New York, 1995).

Rader et al., "Introduction TPEs," *Modern Plastics Mid–October Encyclopedia Issue,* pp. 122–132, (Oct.).

Schaubert et al., "Effect of Microstrip Antenna Substrate Thickness and Permittivity: Comparison of Theories with Experiment," *IEEE Trans. on Antennas and Propagation,* vol. 37, No. 6, pp. 677–682 (Jun. 1989).

Carver, K. et al., "Microstrip Antenna Technology," *IEEE Transactions on Antennas and Propagation,* vol. AP–29, No. 1, pp. 2–24 (Jan. 1981).

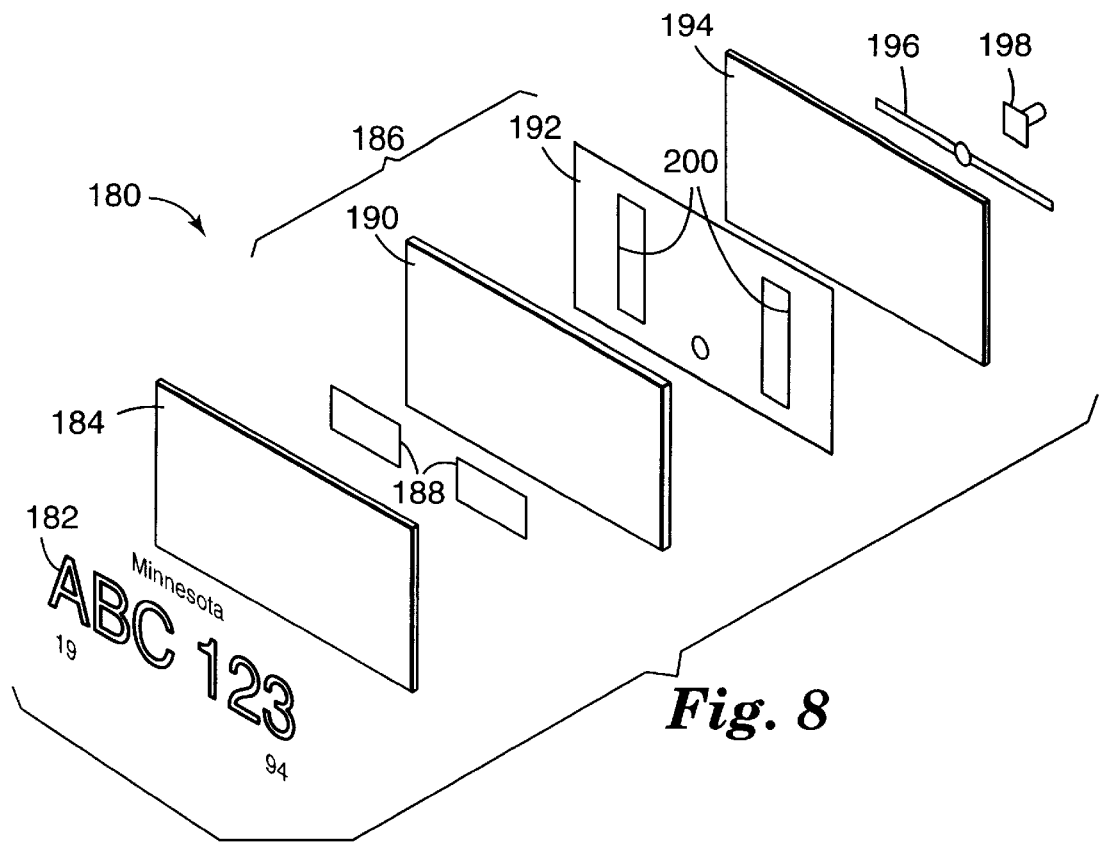
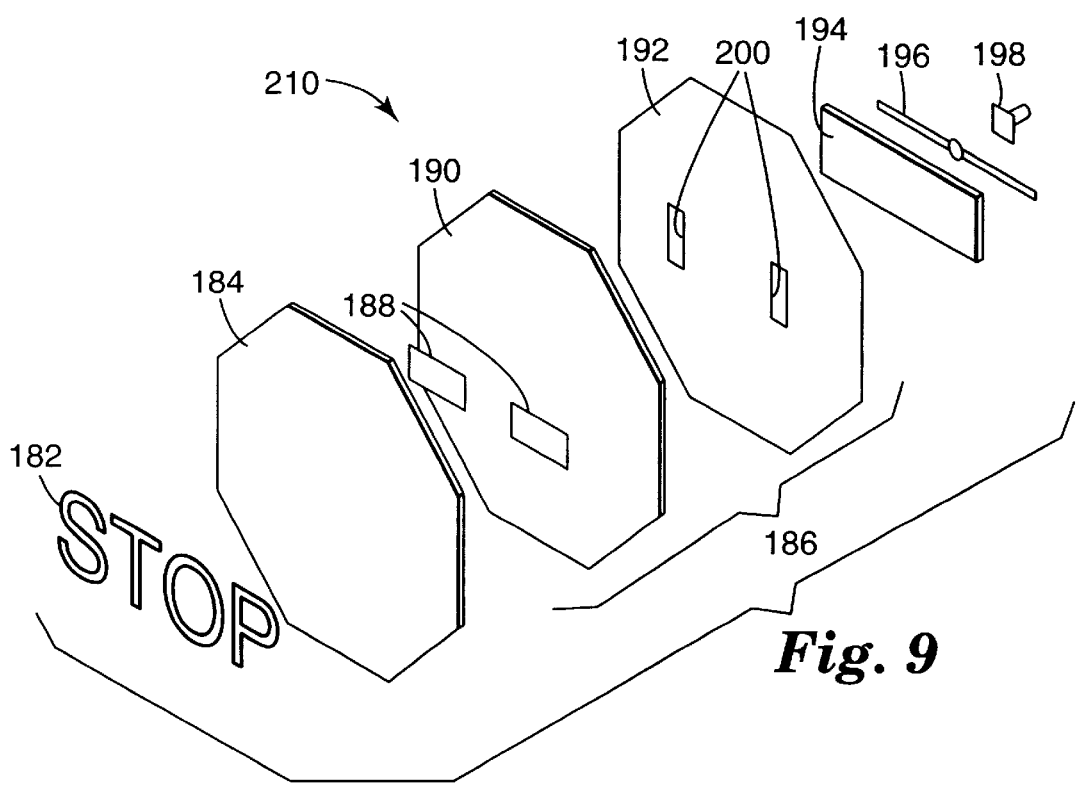

ELECTRICAL AND ELECTROMAGNETIC APPARATUSES USING LAMINATED STRUCTURES HAVING THERMOPLASTIC ELASTOMERIC AND CONDUCTIVE LAYERS

FIELD OF THE INVENTION

The present invention generally relates to patterned laminated structures having at least one thermoplastic elastomeric layer. More specifically, the present invention relates to laminated electrical or electromagnetic structures, such as antennas or printed circuit boards, utilizing such laminated structures.

BACKGROUND OF THE INVENTION

Many substrate materials with particular electrical properties for the mounting of electronic devices are well known in the art, and are used widely in many different types of electronic devices. For example, laminates serve predominantly as substrates for printed circuits and the like and are conventionally made up of resin-impregnated sheets which are cut into leaves or panels and superimposed into layers. The layers are placed under heat and pressure and joined to form a solid unit. The resulting laminates can be covered on one or both sides by laminating with a metallic material, or can be provided with metal layers by well-known deposition methods.

A wide range of polymeric materials are used as substrate or laminate elements in electronics applications, and a great deal of information regarding their properties is known. See, for example, Relation of Structure to Electrical Properties article (need cite). These polymeric materials are electrical insulators, i.e. they may withstand a potential difference between different points of a given piece of material with the passage of only a small electric current and a low dissipation energy. In certain applications the influence of a polymeric material on the capacitance of a condenser, known as its dielectric constant, becomes particularly important. The dielectric constant of a material, $\epsilon_r$, is defined as the ratio of the condenser capacity, using the given material as a dielectric, to the capacity of the same condenser without the dielectric.

When a polymeric material is placed in an electric field, its dielectric constant depends on both electronic polarization effects within its molecular structure and on dipole polarization effects with neighboring molecules. Therefore, a symmetrical or non-polar molecule, which experiences only electronic polarization effects, will have a lower dielectric constant than a polar molecule, which is under the influence of both electronic and dipole polarization effects. Since dipole polarization involves movement of part or even the whole of the molecule, the dielectric constant of polar molecules will depend on the "internal viscosity", i.e. the out of step motions of the dipoles, in the material.

This internal viscosity also produces dielectric power losses at certain frequencies when the dielectric material is placed in an alternating electric field. These losses are measured as the fraction of energy absorbed per cycle by the dielectric from the electric field. The power factor and the dissipation factor arise by considering the delay between the changes in the field and the change in polarization, which in turn leads to a current in a condenser leading the voltage across it when a dielectric is present. The angle of lead is referred to as the phase angle $\theta$, while the term $90-\theta$ is known as the loss angle, $\delta$. The dissipation factor, or loss tangent, for a particular material is tan $\delta$.

An important first step in the design of any electronic device which will absorb or transmit energy is the selection of an appropriate dielectric substrate material. There is no one ideal substrate, and the material selected depends on the properties required for the intended application. The most important properties of a particular material are its dielectric constant ($\epsilon_r$) and loss tangent (tan $\delta$) in the selected temperature and frequency range over which the device will operate. Generally, a low loss tangent suggests excellent energy transmittance, and such materials are useful in the design of electronic devices such as antennas. Conversely, a microwave or radar absorber may require a dielectric material with a much higher loss tangent. Low frequency, low loss applications, such as tapered slot antennas, require a material with high dielectric constant, while patch antennas require a low loss, low dielectric constant material. The bandwidth and efficiency of the microstrip patch antenna may also increased by selecting a material with a lower dielectric constant.

However, dielectric properties of a polymeric material are not the only consideration in designing a substrate for an electronic device. Processing considerations are also important, such as dimensional stability, resistance to temperature, humidity and aging, resistance to chemicals, tensile and structural strengths, flexibility, machinability, impact resistance, strain relief, conformability, bondability and amenability to cladding.

The dielectric properties of the substrate material, particularly low loss tangent, are important in a microstrip antenna. The structure of the microstrip antenna, including its radiator and transmission line feed, is a well known (see, for example, Bahl et al., *Microstrip Antennas*, Artech House, 1980; Pozar and Shaubert, eds., *Microstrip Antennas-The Analysis and Design of Microstrip Antennas and Anrays*, IEEE Press 1995.). In its simplest form, the microstrip patch antenna (MPA) may be a shaped metal conductor fed at one of its edges by an integral microstrip transmission line. This shaped transmission line/radiator structure is typically supported a short distance above a ground plane by a dielectric sheet or layer having a thickness substantially less than one-fourth wavelength at the intended operating frequency of the antenna (generally on the order of one-tenth wavelength or less). The resonance dimension of the shaped radiator patch is typically selected to be one-half wavelength, thus providing a pair of radiating slots between opposed edges (e.g. transverse to the feedline) and the underlying ground plane. The transverse or non-radiant dimension is typically selected, in part, as a function of the desired radiated power. If the non-resonant dimension is on the order of one wavelength or more, multiple feed points may be provided by, for example, a corporate feed structure network. Microstrip patch antennas are described in numerous patents and publications, such as, for example, U.S. Pat. No. 4,887,089 to Shibata, et al., U.S. Pat. No. 5,055,854 to Gustafsson, U.S. Pat. No. 4,963,891 to Aoyagi et al., U.S. Pat. No. 5,070,340 to Diaz, and Tarot, et al., *New Technology to Realize Printed Radiating Elements*, Microwave and Optical Technology Letters, vol. 9, no. 1, May 1995.

In addition to the MPA, other types of microstrip antennas include microstrip traveling wave antennas, which consist of chain-shaped periodic conductors on a substrate backed by a ground plane. Microstrip slot antennas comprise a slot cut in the ground plane perpendicular to the strip conductor of a microstrip feed line.

Desired antenna characteristics may be obtained with a single microstrip element as described above, but characteristics such as high gain, beam scanning, or steering capability may be obtained by combining discrete radiators into arrays. Microstrip antenna arrays are described in many references, including, for example, U.S. Pat. No. 4,173,019 to Williams, and U.S. Pat. Nos. 4,914,445 and 4,937,585 to Shoemaker, and references cited therein.

A wide variety of materials are available for use as dielectrics for microstrip antennas (See, for example, Bahl, et al., *Microstrip Antennas*, pages 317–327 and references cited therein; Carver and Mnk, *Microstrip Antenna Technology*, IEEE Trans. Antennas Propaga, vol. AP-29, no. 1, page 2–24, Jan. 1981.). Typical substrate materials may include polytetrafluoroethylene (PTFE), crystalline thermoplastics such as polystyrene, polyethylene and polypropylene, silicones, polyphenylene oxide (PPO), polyester, polyimides, mica, fiberglass, alumina and beryllia.

Following selection of a dielectric material for a particular application, conventional microstrip antenna structures may be conveniently formed by photochemical etching processes similar to those used in the manufacture of printed circuit boards. A microstrip antenna assembly is formed from a laminate, which in its simplest form is a dielectric sheet material with a thin layer of conductive metal, such as copper, adhered to its opposed sides. One conductive layer of the laminate normally forms the ground plane, and conductive material may be removed from the opposed layer by chemical etching or similar processes to form the very thin microstrip radiator and interconnected transmission line structure as shaped conductive patches on the dielectric sheet. Examples of laminates for microstrip antennas are described in U.S. Pat. No. 4,914,445 to Shoemaker, U.S. Pat. No. 4,937,585 to Shoemaker and U.S. Pat. No. 4,833,005 to Klaar et al.

As reported in U.S. Pat. No. 4,816,836 to Lalezari, an effective microstrip antenna laminate structure should be conformable and mountable to a curved surface. A microstrip antenna is often mounted on an external, curved surface of airplanes, missiles, artillery shells and the like, and mounting to a curved surface provides a low profile and reduces turbulence. Generally, the mounting surface has a convex shape, and the antenna assembly is simply deformed and adhered directly on the curved surface. As the antenna is bent around a small radius curve, the outer convex surface is placed under substantial tension and must stretch, which causes a non-flexible material to crack. The crack ultimately results in deformation and tearing of the copper antenna elements, which pulls the antenna apart. This cracking is a particular problem with rigid, crystalline polymeric materials and foams.

The Lalezari reference describes an antenna with a multi-layer PTFE and fiberglass substrate and a method for mounting the antenna on a curved surface. The antenna structure described in this patent comprises a relatively thin dielectric substrate with antenna elements on a surface thereof, and a second relatively thick dielectric substrate. As shown in FIG. 2 of the Lalezari patent, to adhere the antenna structure to the curved surface, the thick dielectric substrate material 41*b* must initially be adhered to the curved surface as a spacer. The thinner first dielectric substrate 41*a* is then adhered to the spacer 41*b*. The method described in Lalezari illustrates that PTFE dielectric substrates lack the conformability required in many applications. In addition, the multi-layer structure is expensive and difficult to manufacture.

Another desirable characteristic of an antenna dielectric material is weatherability. As noted above, microstrip antennas are typically mounted on external surfaces which are exposed to severe weather conditions, and antenna properties may be significantly affected if the dielectric layer absorbs moisture or has poor thermal stability over its operating temperature range. Liquid water has a very high dielectric constant, and moisture absorption by foamed dielectric substrate materials may significantly alter antenna tune and ultimately result in substrate deformation. Conventional foamed materials readily absorb moisture and have extremely poor impact resistance, which limits their desirability as antenna substrates or laminate layers.

If weatherability and toughness are a concern, it is well known in the art to select PTFE as a dielectric substrate material for antenna applications. The PTFE may also be reinforced with ceramics or glass fibers, or formed into a cloth laminate. As noted above, these materials are not sufficiently conformable for some applications. PTFE is also difficult to extrude, and is not compatible with many conventional adhesives and antenna materials. In addition, a significant disadvantage is PTFE's high manufacturing cost.

There is a need for a tunable dielectric substrate material which may be manufactured inexpensively and easily in a wide variety of laminate configurations without sacrifice of critical performance properties. At present no low-cost dielectric substrate material is commercially available which provides the desired combination of properties for electronic device design, such as variable $\epsilon_r$ and tan $\delta$, weatherability and toughness, conformability, and processability.

SUMMARY OF THE INVENTION

The present invention describes electrical and electromagnetic apparatuses that use a flexible polymeric substrate material laminated or printed with a conductive layer. In one embodiment, the polymeric substrate material is a low dielectric loss thermoplastic elastomer substrate or laminate material having a loss tangent less than about 0.005. The low loss thermoplastic elastomer of the invention comprises a thermoplastic polymeric component comprising polar or non-polar monomeric units, or mixtures thereof, and an elastomeric polymeric component comprising polar or non-polar monomeric units, and specifically excluding mixtures thereof, such that the resultant loss tangent of the thermoplastic elastomer is less than about 0.003. The thermoplastic elastomers may be block copolymers, graft copolymers, or multi-phase dispersions, and multi-phase dispersions having an olefinic thermoplastic component and an elastomeric component of an ethylene-propylene rubber are preferred. A thermoplastic elastomer with a thermoplastic component comprising crystalline polypropylene and an elastomeric component comprising ethylene-propylene-diene monomer (EPDM) are particularly preferred. The dielectric materials of the first embodiment are particularly preferred for use in electronic devices such as microstrip antennas.

The dielectric material may also be a high dielectric loss thermoplastic elastomer substrate or laminate material having a loss tangent greater than about 0.005 and up to about 0.200. The thermoplastic elastomer of this embodiment of the invention comprises a thermoplastic polymeric component comprising polar or non-polar monomeric units, or mixtures thereof, and an elastomeric polymeric component comprising polar or non-polar monomeric units, or mixtures thereof, such that the resultant loss tangent of the thermoplastic elastomer is greater than about 0.005 and up to about 0.200.

The thermoplastic elastomer substrate material of the invention is compatible with a wide variety of fillers. A sufficient amount of a filler may be added to the thermoplastic elastomer substrate material to provide a predetermined dielectric constant over a broad range of about 1 to about 50, preferably about 2 to about 35. Particularly good low-loss dielectric performance has been observed when the filler material is a doped or undoped "capacitor grade" ceramic, such as barium titanate or lead oxide. The variability of the dielectric constant of the thermoplastic elastomer material allows optimization of electrical or electromagnetic properties of printed circuit boards or antennas.

BRIEF DESCRIPTION OF THE DRAWINGS

The present invention will be more fully described with reference to the accompanying drawings wherein like reference numerals identify corresponding components, and:

FIGS. 6 shows the bandwidth of the aperture coupled microstrip antenna shown in FIG. 3a;

FIG. 8 shows an exploded view of an electronic license plate of the present invention; and FIG. 9 shows an exploded view of an electronic sign of the present invention.

DETAILED DESCRIPTION OF A PREFERRED EMBODIMENT

Figure 1A:
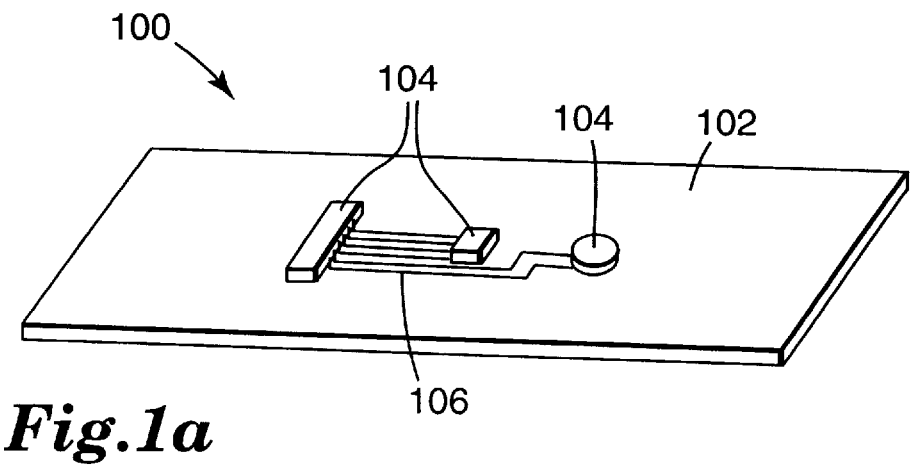
FIGS. 1a and 1b show a perspective view and a side cross-sectional view of a printed circuit board of the present invention.

The substrate material of the present invention is a polymeric material comprising a thermoplastic elastomer. "Thermoplastic elastomers", as used herein, refers to a class of polymeric substances which combine the processability (when molten) of thermoplastic materials with the functional performance and properties of conventional thermosetting rubbers (when in their non-molten state).

The low loss thermoplastic elastomers of the invention may comprise any thermoplastic polymeric component and any elastomeric polymeric component which provides a predetermined dielectric constant and resultant loss tangent (tan δ) of less than about 0.005, preferably less than about 0.003. The low loss thermoplastic elastomer of the invention comprises a thermoplastic polymeric component comprising polar or non-polar monomeric units, or mixtures thereof, and an elastomeric polymeric component comprising polar or non-polar monomeric units, and specifically excluding mixtures thereof, such that the resultant loss tangent of the thermoplastic elastomer is less than about 0.005, preferably less than about 0.003.

As explained in the Kirk-Othmer *Encyclopedia of Chemical Technology*, 4th ed., vol. 9 at 15, thermoplastic elastomers are typically divided into two principal classes: (a) block or graft copolymers; and (b) multi-phase dispersions.

In the block or graft thermoplastic elastomers, the hard and elastomeric phases are chemically bonded by block or graft polymerization, and have the structure A-B-A or (A-B)$_n$, where A is a hard or thermoplastic phase and B is a soft or elastomeric phase. For the purpose of the present invention, A-B-A structures are preferred for their superior physical properties. In block/graft thermoplastic elastomers the hard polymer end segments form separate physical regions, referred to as domains, dispersed in a continuous elastomer phase. Most of the polymer molecules have hard segments which act as physical crosslinks at room temperature and tie the elastomer chains together in a three dimensional network. When the material is heated or dissolved in solvents, the domains lose their strength, and the polymer may flow. Upon cooling or solvent evaporation, the domains harden and the three dimensional network retains its physical integrity.

In the low loss embodiment of the present invention, thermoplastic polymeric component A may comprise any polar or non-polar monomeric unit, or mixtures thereof, and elastomeric polymeric component B may comprise any polar or non-polar monomeric unit, including mixtures and copolymers thereof, such that the bonded structure thereof has a resultant loss tangent of less than about 0.005, preferably less than about 0.003.

As noted in the above discussion, polymers with low dielectric loss typically have non-polar or substantially non-polar substituents, and thermoplastic elastomers with thermoplastic and elastomeric polymeric components comprised of non-polar monomeric units are preferred for use in the present invention. The term "non-polar" as used herein refers to monomeric units that are free from dipoles or in which the dipoles are substantially vectorially balanced. In these polymeric materials the dielectric properties are principally a result of electronic polarization effects.

To provide a low-loss dielectric material in the present invention the thermoplastic polymeric component A may be comprised of the following polar or non-polar monomeric units, for example: styrene, α-methylstyrene, olefins, halogenated olefins, sulfones, urethanes, esters, amides, carbonates, and imides, acrylonitrile, and co-polymers and mixtures thereof. Non-polar monomeric units such as, for example, styrene and α-methylstyrene, and olefins such as propylene and ethylene, and copolymers and mixtures thereof, are preferred. The thermoplastic polymeric component is preferably selected from polystyrene, poly(α-methylstyrene), and polyolefins. Polyolefins are preferred, and polypropylene and polyethylene, and copolymers of propylene and ethylene, are particularly preferred.

The elastomeric polymeric component B in the low-loss dielectric material of the invention may comprise any of the following polar monomeric units, for example: esters, ethers, and copolymers and mixtures thereof. The elastomeric component B may comprise any of the following non-polar monomeric units, for example: butadiene, isoprene, olefins such as ethylene-co-butylene, siloxanes, and isobutylene, and mixtures and copolymers thereof. Mixtures and copolymers of polar and non-polar monomeric units are not contemplated in the elastomeric component of the low-loss thermoplastic elastomers of the invention. Non-polar monomeric units such as butadiene, isoprene olefins, siloxanes and mixtures and copolymers thereof are preferred, and the elastomeric component B is preferably selected from polybutadiene, polyisoprene, poly(ethylene-co-butylene), poly(ethylene-co-propylene), polydimethylsiloxane, polyisobutylene, poly(ethylene-co-butylene), and poly(ethylene-co-propylene).

For example, styrenic block copolymeric thermoplastic elastomers which may be useful in the present invention include linear and/or branched materials having a polybutadiene or polyisoprene elastomeric segment available from Union Carbide Chemicals and Plastics Company, Inc., Danbury, Conn., under the trade names Kraton D and Cariflex, and from Philips Petroleum, Bartlesville, Okla. under the trade name Solprene. Linear styreneic block thermoplastic elastomers having a poly(ethylene-co-butylene) (EB) and a poly(ethylene-co-propylene) (EP) elastomeric segment which may be useful in the present invention include EB/EP materials available from Union Carbide Chemicals and Plastics Company, Inc. under the trade name Kraton G, EB materials available from Union Carbide Chemicals and Plastics Company, Inc. under the trade name Elexar, polybutadiene or EB materials available from Great Lakes Terminal and Transport Corp. under the trade name Dynaflex, EB materials available under the trade name Tekron from Teknor Apex, and EB materials with silicone oils available under the trade name C-Flex from Concept. Other useful copolymerized thermoplastic elastomers include materials available under the trade name Engage from Dow, Midland, Mich., and Exact from Exxon, Houston, Tex.

The block/graft copolymer thermoplastic elastomers which may be used in the present invention may be synthesized by any sequential polymerization and step growth process as well known in the art. See, for example, Kirk Othmer *Encyclopedia of Chemical Technology*, 4th ed., vol. 9 at 21–25; *Handbook of Polyolefins*. Vasilie, Seymour, eds. Decker, N.Y., 1993, pages 943–966.

In the second general class of thermoplastic elastomers, multi-phase materials, at least one phase comprises a material that is hard at room temperature, but becomes fluid upon heating, and another phase comprises a softer material that is rubber-like at room temperature. The multi-phase thermoplastic elastomers typically consist of a thermoplastic polymeric component and more rubber-like elastomeric polymeric component. The two components normally form interdispersed multiphase systems, although in some cases a very finely dispersed "single phase" system is formed if the rubber-like phase is crosslinked during high shear mixing. This crosslinking procedure, referred to as "dynamic vulcanization" is described in, for example, U.S. Pat. No. 3,037,954 to Gessler.

In the low loss multi-phase structures of the present invention, the thermoplastic polymeric component preferably comprises any polar or non-polar monomeric unit normally regarded as a thermoplastic, and mixtures and co-polymers thereof. The elastomeric component preferably comprises any polar or non-polar monomeric unit normally regarded as elastomeric, specifically excluding mixtures thereof, such that the multi-phase dispersion has a resultant loss tangent of less than about 0.005, preferably less than about 0.003.

The thermoplastic component of the low-loss multi-phase thermoplastic elastomers of the invention may be comprised of the following polar and non-polar monomeric units: olefins, such as propylene and ethylene, vinyls and mixtures and co-polymers thereof. For the purpose of the present invention, the thermoplastic polymeric component is preferably selected from non-polar monomeric units, and polyolefins, particularly polypropylene and polyethylene, and copolymers with ethylene and propylene monomeric units, are preferred. Isotactic polypropylene is particularly preferred for use as the thermoplastic polymeric component.

The elastomeric polymeric component of the low-loss multi-phase thermoplastic elastomers of the invention may be comprised of crosslinked or uncrosslinked polar rubbers such as nitrile rubber, or crosslinked or uncrosslinked non-polar rubbers such as butyl rubber, natural rubber, ethylene-propylene rubber (EPR), ethylene-propylene diene rubber (EPDM) and silicone rubber. Crosslinked or uncrosslinked non-polar rubbers are preferred, and EPR and EPDM are particularly preferred. The elastomeric rubber component may be uncrosslinked (green), or may be partially or fully crosslinked using typical crosslinking agents (e.g. phenolics and peroxides) during mixing or as part of the dynamic vulcanization process.

Examples of multi-phase thermoplastic elastomers having a crystalline polypropylene thermoplastic polymeric component and EPR or EPDM elastomeric polymeric component which are preferred for use in the low-loss dielectric materials of the present invention include blends available under the tradenames TPR from Advanced Elastomer Systems, Ren-Flex from Dexter, Polytrope from Schulman, Telcar from Teknor Apex, Ferroflex from Ferro, WRD-7-507 from Union Carbide Chemicals and Plastics Company, Inc., and HiFax from Montell USA, Wilmington, Del., and the like. Dynamically vulcanized blends with a crystalline polypropylene thermoplastic polymeric component and an EPDM elastomeric polymeric component which may be used in the present invention include materials available under the tradenames Santoprene from Advanced Elastomer Systems, Sarlink 3000 from Novacor, Telprene from Teknor Apex and HiFax XL from Montell USA. Dynamically vulcanized blends having a polypropylene thermoplastic component and a butyl rubber elastomeric component are available under the tradenames Trefsin from Advanced Elastomer Systems and Sarlink 2000 from Novacor. Dynamically vulcanized blends having a polypropylene thermoplastic component and a natural rubber elastomeric component which may be useful in the present invention are available under the trade name Vyram from Advanced Elastomer Systems.

The multi-phase thermoplastic elastomers which may be used in the present invention may be compounded using a wide variety of conventional procedures. The thermoplastic elastomers are typically produced by mechanically mixing the hard thermoplastic polymeric component and the rubber-like elastomeric polymeric component under high shear or by extrusion, although it is sometimes possible to produce the thermoplastic elastomer in situ in a reactor during polymerization. See, for example, Legge, Holden and Schroeder, eds., *Thermoplastic Elastomers-A Comprehensive Review*, Oxford University Press, 1987; Ivan article.

Of the above described thermoplastic elastomers, the multi-phase combinations are preferred for use in the low loss dielectric materials of the present invention. Of the thermoplastic olefinic polymeric components, propylene and ethylene are preferred, and crystalline, isotactic polypropylene is particularly preferred. Crosslinked or uncrosslinked EPDM is particularly preferred as the elastomeric polymeric component in the present invention, and uncrosslinked EPDM is most preferred for its combination of physical properties and low cost. Materials which may be used in the present invention are described in U.S. Pat. Nos. 3,876,454 and 3,470,127 to Snell et al, which are incorporated herein by reference. The relative proportions of polypropylene thermoplastic component and the EPDM elastomeric component will vary widely depending on the combination of properties desired in a particular application.

Multi-phase thermoplastic elastomers which are particularly preferred for use in the present invention are available under the tradenames HiFax from Montell USA of Wilmington, Del., and WRD from Union Carbide Chemicals and Plastics Company, Inc., Danbury, Conn. The HiFax materials are blends of crosslinked or non-crosslinked rubber, such as EPDK, EPR or butyl, with an isotactic olefin plastic such as polyethylene or polypropylene. A particularly preferred material, for reasons of cost and processability, referred to by the manufacturer as a "thermoplastic olefin", is HiFax CA10, a blend of a noncrosslinked (green) rubber, preferably EPR or EPDM, most preferably EPDM, with crystalline polypropylene. As reported by the manufacturer, the HiFax CA10 includes greater than about 60% by weight of the polypropylene thermoplastic component and about 40% by weight of the EPR/EPDM elastomeric component., a Shore Hardness of about 40 D as measured according to ASTM D-2240, and tensile strength of about 2200 Psi as measured according to ASTM D-636. The non-crosslinked rubber component is reported to function as a non-migratory polymeric plasticizer, and the HiFax CA10G material has good flex fatigue resistance.

The neat thermoplastic elastomers used in the low-loss materials of the present invention should have a dielectric constant of less than about 3, preferably less than about 2.5, and the loss tangent (tan δ) should preferably be less than about 0.003. Since polarization is substantially instantaneous in these materials, the dielectric constant and loss tangent will be substantially independent of frequency, and such independence is expected over a wide frequency range, at least from about 300 MHz to about 20 GHz. A wide variety of measurement apparatus may be used to determine the dielectric properties of a polymeric material, but for the purposes of the present invention an RF impedance/material analyzer, such as the 4291A available from Hewlett Packard, is preferred.

In another embodiment, the dielectric material of the present invention is a high dielectric loss thermoplastic elastomer substrate having a loss tangent of greater than about 0.005 up to about 0.200. The thermoplastic elastomer of the invention comprises a thermoplastic polymeric component comprising polar or non-polar monomeric units, or mixtures thereof, and an elastomeric polymeric component comprising polar or non-polar monomeric units, or mixtures thereof, such that the resultant loss tangent of the thermoplastic elastomer is greater than about 0.005 and up to about 0.200. To provide a dielectric material with high dielectric loss, a thermoplastic polymeric component comprising polar monomeric units and an elastomeric thermoplastic component comprising polar monomeric units are preferred.

However, the dielectric constant and loss tangent of a thermoplastic elastomeric material may be tailored for a specific application by adding a sufficient amount of a filler to provide a predetermined dielectric constant of from about 1 to about 50, preferably about 2 to about 35, while maintaining the loss tangent at a predetermined level as described above. Fillers which may be added to the thermoplastic elastomers tune their dielectric properties for a particular application include well known materials such as silica, alumina, glass bubbles, barium titanate ($BaTiO_3$), lead oxide (PbO) titanium dioxide ($TiO_2$) and mixtures thereof Preferred for use as fillers in the present invention are titanates with a perovskite crystalline structure, often referred to in the art as "capacitor grade" ceramics. These titanates may be doped with a wide range of impurities, such as, for example, niobium, to tailor their dielectric properties for a particular application. Particularly preferred for use in the present invention are solid state reacted powders, available in a non-crystalline or a sintered form under the trade name TICON from TAM Ceramics, Niagara Falls, N.Y. Particularly preferred capacitor grade ceramics include materials available under the tradenames TICON COF 40, TICON COF 50, TICON COF-70, TICON CN and TAMTRON Y5V183U and Y5V153G from TAM Ceramics.

The fillers used in the present invention may also include other polymeric materials. For example, to tailor dielectric and/or physical properties for a particular application, a polymer may be mechanically blended with the filled or unfilled thermoplastic elastomer of the invention to create a dispersion of the polymer in the thermoplastic elastomer. The use of polymeric fillers allows even greater flexibility in controlling the dielectric and/or mechanical properties of the thermoplastic elastomers of the invention.

The amount of filler added will depend on the dielectric constant and loss tangent required for a particular application, but a range of up to about 70% by volume of thermoplastic elastomer, preferably about 5% to about 60% by volume, is preferred. If the filler loading is greater than about 60–70% by volume, the physical properties of the resultant material, particularly its flexibility and tensile strength, may be adversely affected. The fillers may be compounded with the thermoplastic elastomers using any conventional method such as calendering, extrusion, and dry blending, or combinations thereof The dielectric properties of the loaded or unloaded thermoplastic elastomers should remain relatively constant when the material is exposed to moisture as evaluated water absorption according to test procedures generally outlined in ASTM C272. The dielectric properties of the loaded or unloaded thermoplastic elastomers should remain relatively constant over a wide range of temperatures of about −30° C. to about 70° C.

The thermoplastic elastomer selected for use in the present invention should be flexible when bent around a mandrel and conformable to a convex surface. Preferably, the thermoplastic elastomer should not break or stress whiten when bent around a mandrel of diameter less than about 1 inch (2.5 cm), more preferably when bent around a mandrel with diameter less than about 0.5 inch (1.25 cm), and most preferably when bent around a mandrel of diameter of about 0.125 inch (0.318 cm) according to a test procedure generally outlined in ASTM D522. The dielectric properties of the loaded or unloaded thermoplastic elastomer should also remain stable when the material is bent around a mandrel or conformed to a convex surface.

The loaded or unloaded thermoplastic elastomers which are used in the present invention may be easily processed into sheet films using an extruder, and may optionally be uniaxially or biaxially oriented. The sheet films may have a wide range of thicknesses and their dielectric properties may be tailored for a specific application. The thermoplastic elastomers of the invention may be readily bent around rolls during web processing, which makes possible prime coating, adhesive coating or converting operations on the dielectric material.

As is well known in the art, glass fibers, glass or alumina cloth, silica, quartz, ceramic powder and the like may be added to enhance the physical properties of the thermoplastic elastomer. The amount of filler added to the thermoplastic elastomer to enhance physical properties will also depend on the application, but, as is well known in the art, high loadings of filler may alter the flexibility and/or ultimate tensile strength of the thermoplastic elastomer material.

The thermoplastic elastomer used in the present invention may be treated with corona discharge or other surface treatments to enhance its physical properties. The porosity of the loaded or unloaded thermoplastic elastomer may be controlled to tailor dielectric properties. Methods of enhancing porosity include adding a chemical foaming agent, injecting an inert gas such as nitrogen or fluorocarbon, or by compounding with a plasticizer and subsequent extraction of the plasticizer as described in U.S. Pat. No. 4,963,891 to Aoyagi et al. Again, while increasing porosity may enhance dielectric properties, porosity may adversely affect the physical properties of the material. Further examples illustrating the thermoplastic elastomer material contemplated for use with the present invention is described in commonly-assigned co-pending U.S. patent application Ser. No. 08/608,779, entitled "Thermoplastic Elastomeric Substrate Material With Tunable Dielectric Properties and Laminates Thereof".

The thermoplastic elastomers of the present invention may be provided in the form of laminates. The laminates of the invention may be one-ply, which considerably simplifies the manufacturing process compared to conventional substrate materials for electronic applications. Single or multiple layers of the thermoplastic elastomer substrate, or a layer of thermoplastic elastomer and one or more layers of another dielectric material, may be laminated on one side or on both sides with one or more layers of a metal, such as, for example, gold, silver, copper, aluminum, electrolytic or low oxygen content copper, nickel, chromium, alloys available under the trade name Inconel, and alloys thereof. The metallic layer may be coated with an anticorrosive coating. An optional adhesion promoter may be added between the metallic layer and the thermoplastic elastomer substrate. A conductive ink, spray or epoxy may serve as the metallic layer as described in U.S. Pat. No. 4,937,585 to Shoemaker.

The thickness of the thermoplastic elastomer substrate layer may vary widely depending on the intended application.

The substrate may be further laminated to additional dielectric layers and/or metallic layers to provide a laminate structure with specific dielectric and physical properties. The additional dielectric layers may be polar or non-polar, can exhibit differing crosslinking densities and/or dielectric properties, or can contain differing reinforcing or dielectric enhancing materials such as those mentioned above. For example, the additional dielectric layer(s) may comprise polyolefins, polyamides, polyethylene terepthalate, and polar or non-polar thermoplastic elastomer which may be the same or different from the thermoplastic elastomer in the substrate.

The thermoplastic elastomer/metallic laminate may be further laminated to an additional reinforcing layer of a polymeric material, or may be laminated on two sides with a polymeric material, which may be the same or different. The thermoplastic elastomer/metallic laminate of the invention may be further laminated to other reinforcing materials, such as, for example, to a circuit board material such as FR-4 or the like, or to a metallic sheet. The metallic layer may be covered with an optional removable protective sheet if desired. In addition, copper damage inhibitors, anti-ultraviolet agents, antioxidants and the like may be added to any of the laminate layers.

The bonding of the metallic layer to the thermoplastic elastomer substrate of the invention may be performed by any method known in the art. For example, a pressure sensitive adhesive (PSA) may be applied to the thermoplastic elastomer substrate using any conventional lamination system, and the metallic layer may be applied to the PSA with conventional lamination techniques. In the alternative, the metallic layer may be hot laminated to the thermoplastic elastomer substrate using a heated press, available from Carver or Rucker. For example, the laminates may be prepared at a temperature of about 350° F. (175° C.) under a pressure of about 10,000 psi (70 MPa) to about 60,000 psi (400 MPa). A curing time of less than about 10 minutes is preferred. The metallic layer may also be applied to the thermoplastic elastomer substrate using sputtering, stamping or vacuum deposition techniques as is well known in the art. The laminates may be prepared as a continuous web or by processing laminate sheets using a hot lamination procedure.

Variations of laminate structures similar to the laminate structure described hereinabove may be implemented for a variety of electrical or electromagnetic, such as radio frequency, applications. One of the simplest applications of such a laminate structure is as a printed circuit board. Printed wiring on laminated dielectric boards provides a planar interconnection wiring array. When using the dielectric of the present invention, such interconnection arrays may also be etched from a curved surface, as the dielectric is conformable, as described above. Discrete electrical components are mounted on the printed circuit boards and their leads inserted into drilled or punched holes. Packages for microelectronics are similarly mounted. Soldering of the leads to the printed wiring provides both electrical interconnection and mechanical support of the electrical components in the completed circuit assembly.

Figure 1B:
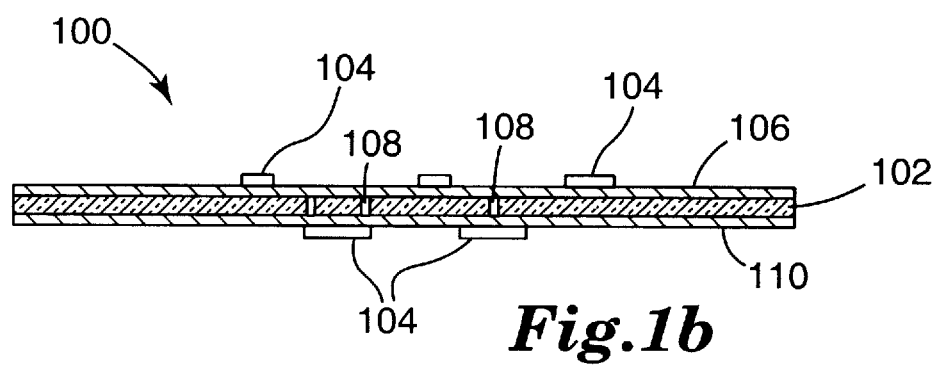

FIGS. 1a and 1b show one embodiment of a printed circuit board of the present invention. Printed circuit board 100 has dielectric substrate 102 having at least one conductive layer 106 laminated thereon using one of the laminating techniques described above. Dielectric substrate 102 is a thermoplastic elastomer material as described above. The printed wiring conductor is typically a metal such as copper, although any suitable conductive material may be used. In one preferred patterning technique, the desired wiring array is printed with a resist on the conductive surface and etching removes the unwanted surface areas, leaving the desired array. In other preferred patterning techniques, the wiring array is built up using well known plating techniques or printing techniques using patterned masks on dielectric substrate 102. Multilayer printed circuit boards having several alternating layers of dielectric layers, at least one of which is the a thermoplastic elastomer material of the present invention and conductive layers, may be laminated together. Plated through holes may be used to provide a variety of connections between the various conductive layers and the components or wiring on the outer layers with the inner layers.

As is well known in the printed circuit board art, electrical components 104 such as surface mounted electrical components or electrical components with wire leads may be mounted on either first conductive layer 106 or second conductive layer 110. In embodiments where electrical components 104 are mounted on both sides of dielectric substrate 102, the components may be electrically connected to the circuit on the opposite side of dielectric substrate using plated through holes 108. Further, when no second conductive layer 110 is laminated to dielectric substrate 102, electrical components 104 may also be mounted directly onto dielectric substrate 102 and electrically connected using plated through holes. While FIGS. 1a and 1b only show a limited number of electrical components and limited conductive wiring, those skilled in the art will readily appreciate that a much larger number of components and wiring will typically exist on a printed circuit board.

Figure 2A:
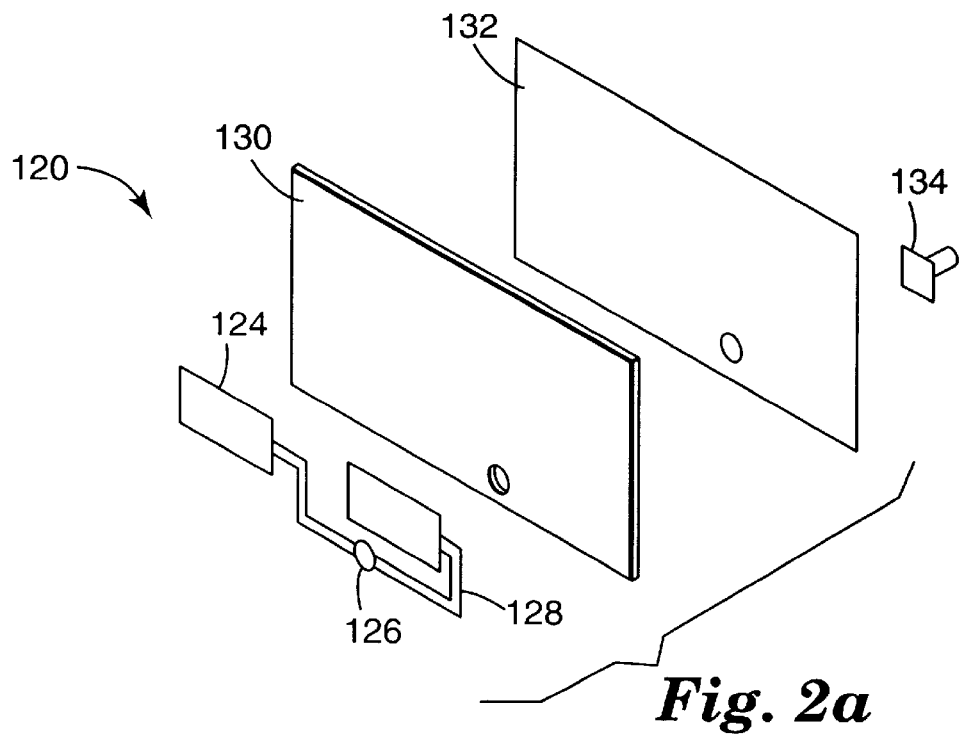
FIGS. 2a and 2b show an exploded view and a side cross-sectional view of a probe-fed microstrip patch antenna of the present invention.
Figure 2B:
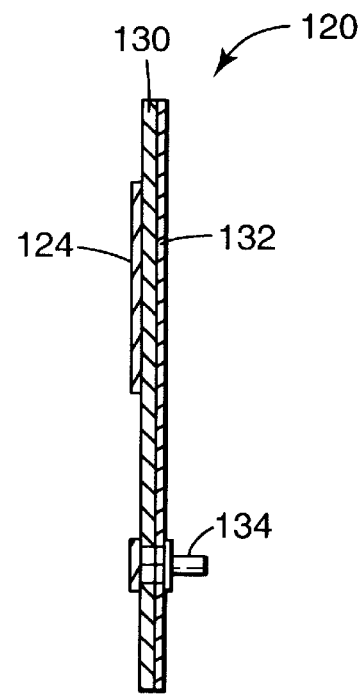

Another application of the laminate structure described above is in antenna applications. The laminate structure of the present invention is particularly well suited for use in microstrip applications, such as microstrip antennas and transmission lines. FIGS. 2a and 2b are exploded and side cross sectional views, respectively, of a probe fed microstrip antenna having two radiating patches. Microstrip antennas generally consist of a metallic patch printed on a grounded dielectric substrate. In FIG. 2a, microstrip antenna 120 may be formed using the above described laminate structure. Radiating patches 124 are formed from the first conductive layer of the laminate structure using well known methods, such as etching or printing. Dielectric layer 130 is formed of a thermoplastic elastomer material as described above. A simple feed network is used to feed radiating elements 124. Connector 134 is a coaxial connector, with its center wire electrically connected to feed point 126 of microstrip feed line 128 and grounded on ground plane 132. Ground plane 132 is a conductive layer laminated to dielectric layer 130. Any external electronic module may be connected to antenna 120 through connector 134.

While radiating elements can be fed using coaxial probes through the ground plane, in microstrip antennas having a large array of radiating elements, the large number of solder joints makes fabrication difficult and lowers reliability. Therefore, an alternate feed structure is sometimes desirable. Further, microstrip antennas operate best when the dielectric substrate is electrically thick with a low dielectric constant. This is because the radiating elements require loosely bound fields for radiation into space. On the other hand, a thin dielectric substrate with a high dielectric constant is preferred for microstrip transmission lines and microwave circuitry. This is because the circuitry has a different electrical function and requires tightly bound fields to prevent undesired radiation or coupling. The antenna structure in FIGS. 3a and 3b has a feed structure without solder joints, allows use of a dielectric substrate having a low dielectric constant for the radiating elements and a dielectric substrate having a high dielectric constant for the microstrip transmission lines.

Figure 3A:
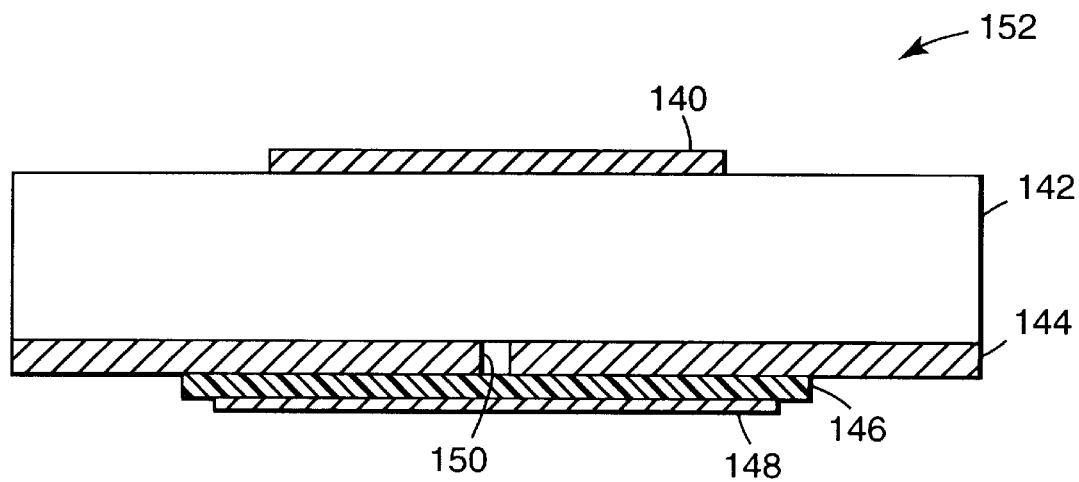
FIGS. 3a and 3b show a side cross-sectional view and an exploded view of an aperture coupled microstrip patch antenna of the present invention.
Figure 3B:
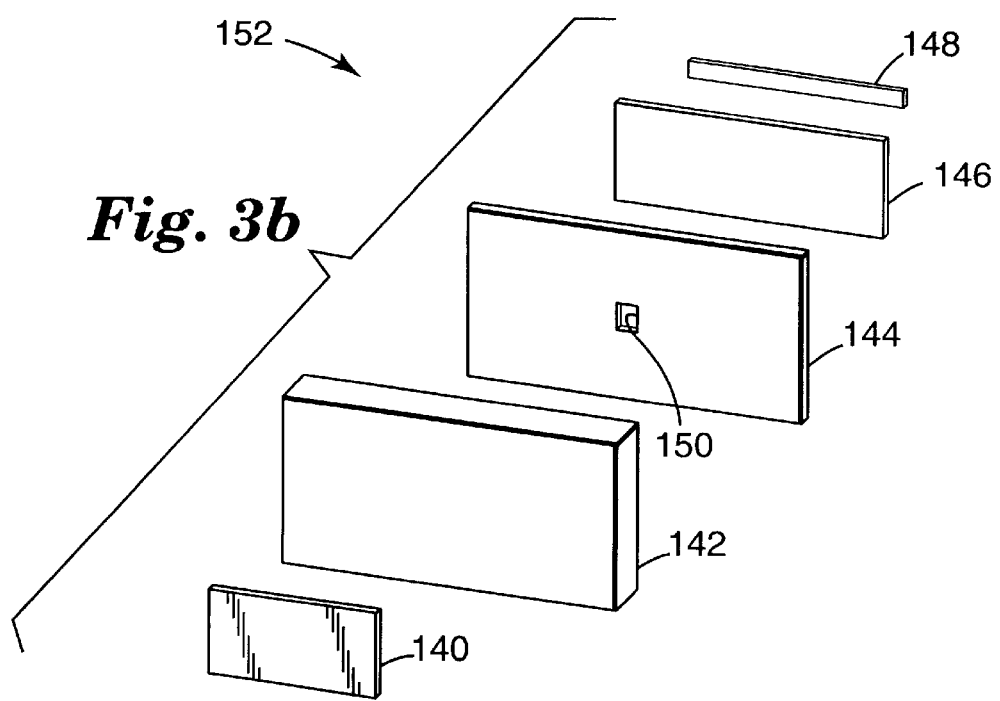

FIGS. 3a and 3b show a side cross-sectional view and an exploded view of a microstrip patch antenna fed by aperture coupling. Microstrip antenna 152 has a radiating element 140 etched from or printed on dielectric substrate 142. Radiating element 140 is preferably copper, but may be any conductive substrate suitable for use in a microstrip antenna. Dielectric substrate 142 is a thermoplastic elastomer material as described above. A second conductive layer 144 is laminated to dielectric substrate 142 and acts as a ground plane for radiating element 140.

The feed structure for the microstrip antenna of FIGS. 3a and 3b will now be described. Radiating elements 140 are coupled to microstrip transmission line 148 by aperture coupling. Aperture coupling does not require a direct electrical connection between radiating elements 140 and transmission line 148. Rather, first dielectric substrate 142 and second dielectric substrate 146 are separated by ground plane 144. First dielectric substrate 142 contains radiating element 140 while second dielectric substrate 146 contains transmission line 148. First dielectric substrate 142 preferably is a relatively thick substrate with a low dielectric constant. Preferably, first dielectric substrate 142 has a dielectric constant in a range between one and five. Second dielectric substrate 146, on the other hand, preferably is a thinner substrate with a higher dielectric constant, preferably with a dielectric constant between two and 50. Second dielectric substrate 146 may be a thermoplastic elastomer material as described above, and preferably is a thermoplastic elastomer material when used in applications where a flexible or weatherable antenna structure is desired. Various fillers have been disclosed hereinabove that may be added to the thermoplastic elastomer material to raise the dielectric constant, thereby allowing second dielectric substrate to have a higher dielectric constant, if desired. Thus, the feed structure of the antenna shown in FIGS. 3a and 3b allows independent optimization of both the radiation and the feed functions by placing the microstrip patch on a thicker dielectric substrate with a low dielectric constant while placing the transmission line on a thinner dielectric substrate with a higher dielectric constant.

Aperture 150 is placed in ground plane 144 and is aligned between radiating element 140 and transmission line 148. In an embodiment where multiple radiating elements are used, multiple apertures may be placed through the ground plane and aligned between the microstrip patches and the transmission line to feed each microstrip patch. Aperture 150 is preferably a rectangular slot and sized based on the physical dimensions of radiating element 140 and transmission line 148, the dielectric constant of first dielectric substrate 142, and the frequency of operation of the antenna. Aperture 150 allows electromagnetic coupling of radiating element 140 to transmission line 148. Transmission line 148 preferably has the form of an open circuit stub, placed for optimum coupling, usually centered over the aperture, and extended approximately one-quarter of a wavelength past the aperture. The width of transmission line 148 depends on the material used for second dielectric substrate 146, the thickness of substrate 146, as well as matching the characteristic impedance of any external electronic modules. Further, a coaxial connector may be connected to transmission line 148 and grounded on ground plane 144 for ease of connection to external electronic modules.

Figure 4:
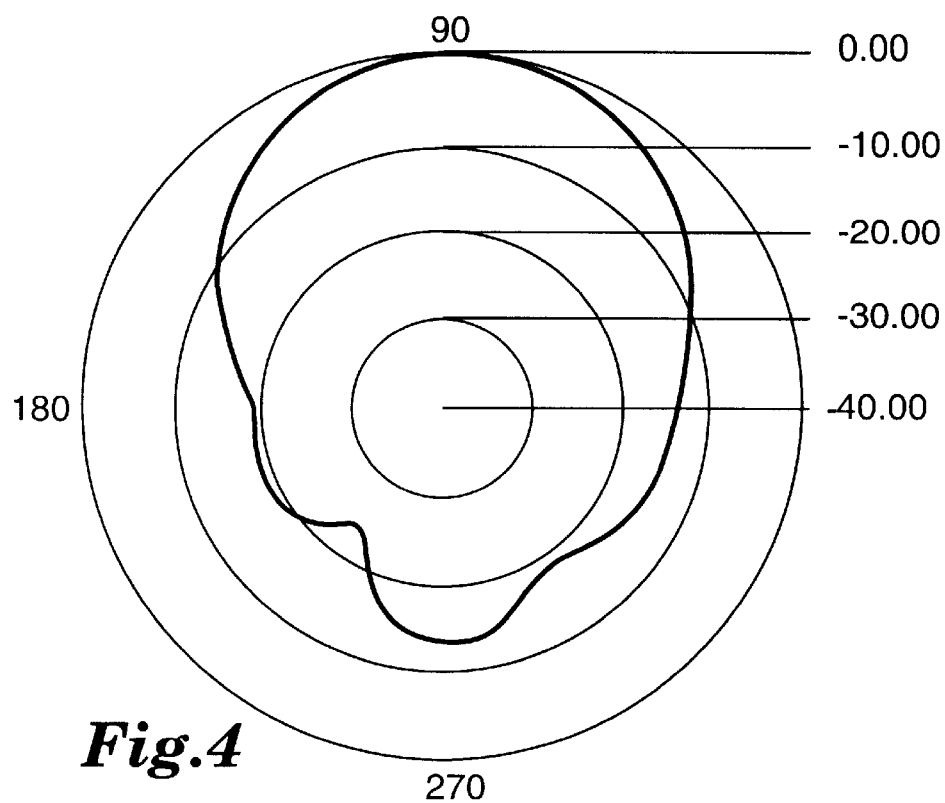
FIGS. 4 and 5 show co-polarized E-plane and H-plane antenna radiation patterns at 905 MHz for the aperture coupled microstrip antenna shown in FIG. 3.
Figure 5:
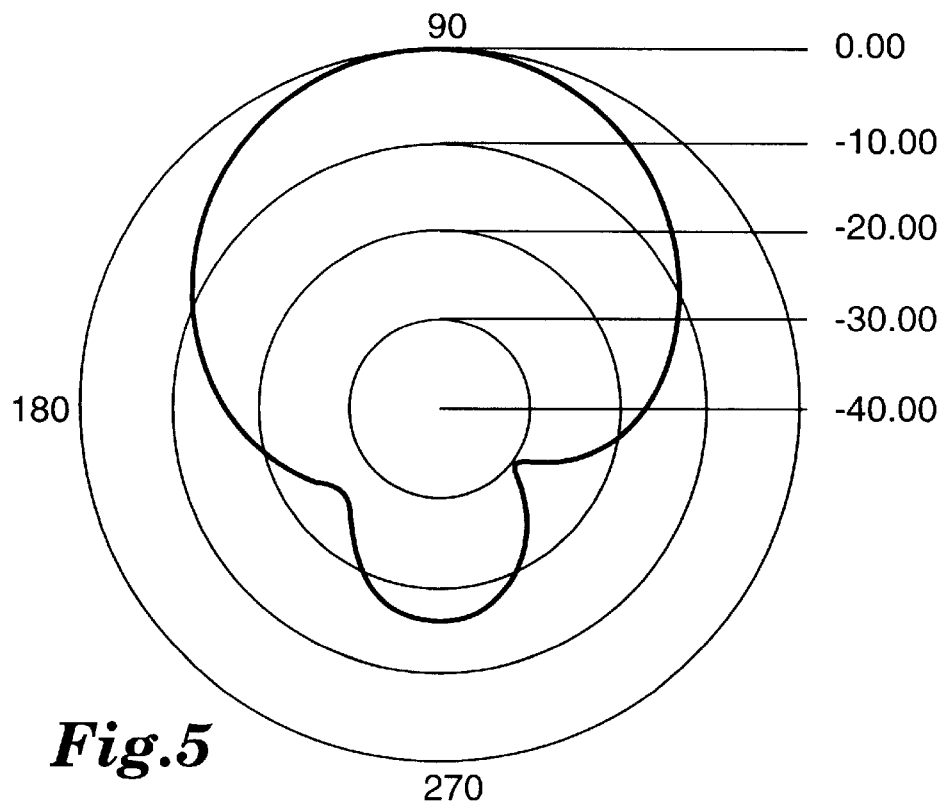
Figure 6:
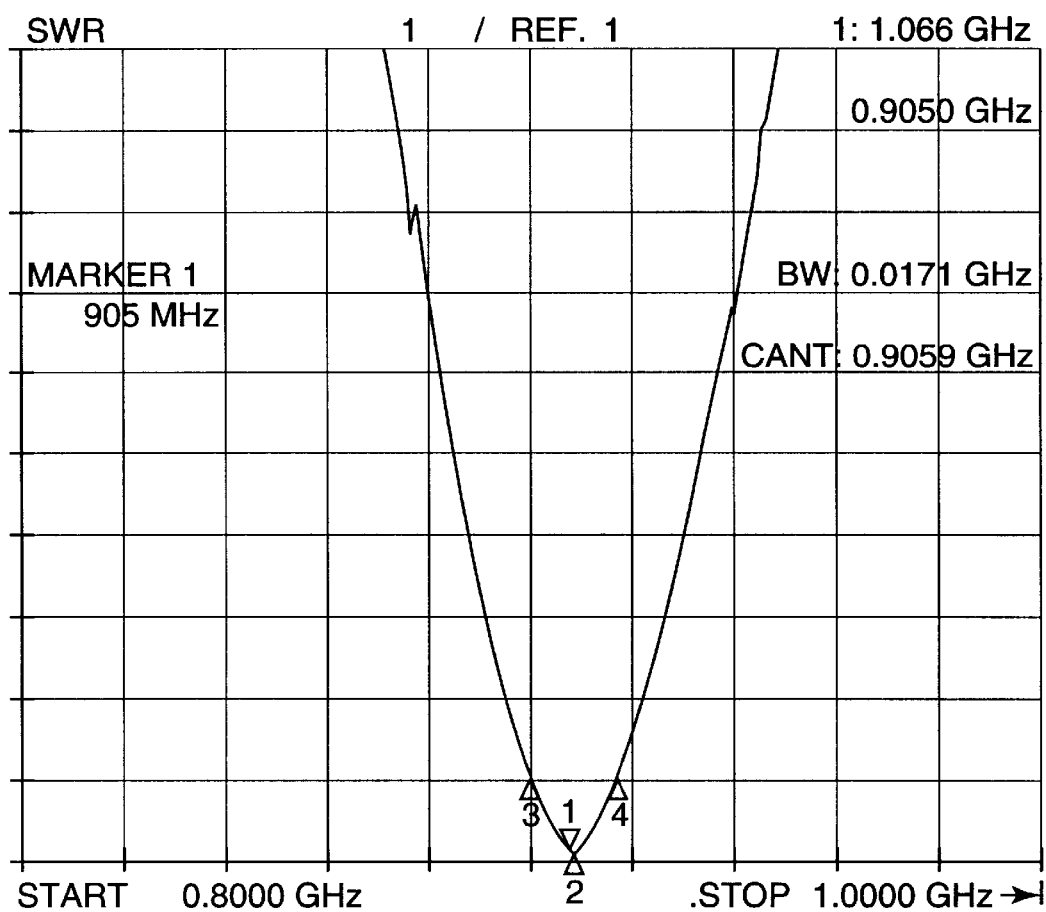

FIG. 4 shows a co-polarized E-plane antenna radiation pattern at 905 MHz for the aperture fed microstrip antenna shown in FIG. 3b. The antenna used to generate the antenna pattern has a single 9.9 cm×14 cm copper patch having a thickness of 180 nm. The copper was sputtered on a 0.5 mm polyester film and laminated to a 3.18 mm thick thermoplastic elastomer film extruded from Montell USA CA10G resin using a pressure sensitive adhesive layer. The antenna radiation pattern shows the gain of the antenna over a 360 degree range. FIG. 5 shows a co-polarized H-plane antenna radiation pattern for the same antenna. As shown in FIGS. 4 and 5, the maximum E-plane gain is 6.27 dB and the maximum H-plane gain is 7.30 dB. The beamwidth at the 3 dB half power point is 61.66 degrees in the E-plane and 67.17 degrees in the H-plane. As shown in FIG. 6, the bandwidth for VSWR 2:1 is 17.1 MHz.

Figure 7A:
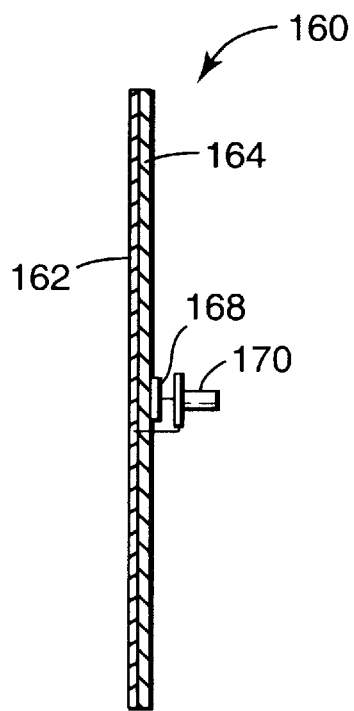
FIGS. 7a and 7b show a side cross-sectional view and an exploded view of a slot antenna of the present invention.
Figure 7B:
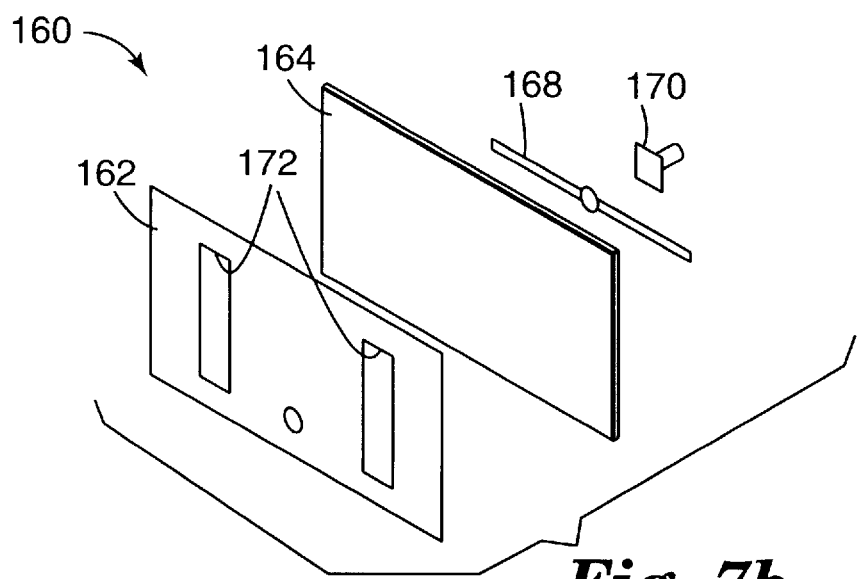

FIGS. 7a and 7b show yet another type of antenna that may utilize the a thermoplastic elastomer material of the present invention. FIGS. 7a and 7b show a side cross-sectional view and an exploded view of a slot antenna for radio frequency communication. Slot antenna 160 has at least one slot 172 cut in conductive layer 162 perpendicular to microstrip transmission line 168 printed or laminated on dielectric substrate 164. Dielectric substrate 164 is a thermoplastic elastomeric material. Energy propagating in transmission line 168 excites slots 172 and an electromagnetic field is set up between transmission line 168 and conductive layer 164. Slots 172 are cut in conductive layer 162 and preferably have a slot length of approximately one-half of a wavelength. The energy is delivered by transmission line 168 which is printed or laminated on dielectric substrate 164 and which is terminated in an open circuit. Coaxial connector 170 may be connected to transmission line 168 and grounded on conductive layer 172 for ease of connection to external modules.

While a number of specific antennas have been described hereinabove for use with a thermoplastic elastomer material, those skilled in the art will readily recognize that the teaching of the present invention contemplates use of the thermoplastic elastomer material as described above with all types of antenna structures that utilize a dielectric layer with at least one conductive layer laminated or printed thereon. For example, spiral antennas, having two interleaved conductive spirals laminated on a the first side of a thermoplastic elastomeric substrate with a ground plane laminated on the second side for wideband applications may use the teachings of the present invention to create a flexible and weatherable antenna structure. Further, a plurality of laminated layers may be used for applications such as Direct Broadcast Satellite (DBS).

As described above, all the antenna structures of the present invention have at least one layer formed of a thermoplastic elastomer material. This material provides many advantages for the antennas of the present invention. As shown above in test results, the thermoplastic elastomer material is particularly well suited for use outdoors, as it is weatherable and its electrical properties, such as dielectric constant and loss tangent, experience little change over a wide temperature range. Because the material absorbs little or no water, no radome is necessary such is used over typical antenna systems that use dielectrics. Further, as described above, the thermoplastic elastomer material is conformable and flexible, allowing manufacture of continuous annular antennas. While most prior art dielectric materials break, or their electrical properties change as they are stretched to an extreme, the electrical properties of antennas of the present invention experience little change when deployed in a flexed application. Because the thermoplastic elastomer material is not brittle, it is also embossable. These properties allow use in many unique applications.

For example, one application that the antennas of the present invention may be used in is in electronic signs and license plates. Electronic license plates and electronic signs have been contemplated for use in electronic vehicular identification and communication systems as well as in vehicle to roadside or vehicle to vehicle communication systems. Electronic license plates and signs are license plates and signs that provide both visual information as traditional license plates and signs provide, as well as electronic information and communication. Some uses of systems using the electronic communication capabilities of electronic license plates and signs include automatic restriction of areas to certain vehicles, traffic control, vehicle theft protection, toll collection, collision avoidance and emergency message communication. Other applications of electronic signs do not always convey visual information, such as applications such as toll collection. FIGS. 8 and 9 show exploded views of an electronic license plate and an electronic sign, respectively, utilizing an aperture coupled microstrip antenna of the present invention. Retroreflective electronic license plate 180 and retroreflective electronic sign 210 have printed information 182 placed on retroreflective sheeting 184. In some embodiments, the retroreflective sheeting is not necessary. In a preferred embodiment, however, retroreflective sheeting 184 may be an encapsulated lens type retroreflective sheeting or a prismatic type retroreflective sheeting. Antenna 186 includes rectangular microstrip patch antennas 188, thermoplastic elastomeric dielectric substrate 190 and ground plane 192. The radiating elements 188 of antenna 186 are coupled to microstrip transmission line 196 by aperture coupling. Microstrip transmission line 196 is spaced from ground plane 192 by a second dielectric substrate 194, preferably a thermoplastic elastomer material, and even more preferably with fillers to raise the dielectric constant to an optimal value. Coaxial connector 198 may be connected to transmission line 196 and grounded on ground plane 192 for ease of connection to external electronic modules.

Although preferred embodiments have been illustrated and described for the present invention, it will be appreciated by those of ordinary skill in the art that any method or apparatus which is calculated to achieve this same purpose may be substituted for the specific configurations and steps shown. It is intended that this covers any adaptations or variations of the present invention. Therefore, it is manifestly intended that this invention be limited only by the appended claims and the equivalents thereof.

What is claimed is:

1. An electromagnetic structure comprising:
    a first conductive substrate having a first side and a second side;
    a first dielectric layer having a first side and a second side, said second side of said first conductive substrate adjacent said first side of said first dielectric layer, said first dielectric layer consisting essentially of a thermoplastic elastomer with a loss tangent (tan □) of less than about 0.2 and a sufficient, non-zero amount of a dielectric filler selected from the group, consisting of undoped ceramics, doped ceramics and mixtures thereof to provide a dielectric constant of about 1 to about 50 in the first dielectric layer;
    a second conductive layer having a first side and a second side, said second side of said first dielectric layer adjacent said first side of said second conductive layer; and
    feeding means for feeding said first conductive substrate.

2. The electromagnetic structure according to claim 1, wherein said first conductive substrate comprises a first microstrip patch.

3. The electromagnetic structure according to claim 2, wherein said feeding means comprises a microstrip transmission line connected to said microstrip patch.

4. The electromagnetic structure according to claim 1, wherein said feeding means comprises:
    a second dielectric substrate having first and second faces, said first face of said second dielectric substrate adjacent said second face of said second conductive layer; and
    a microstrip transmission line having first and second faces, said first face of said transmission line adjacent said second face of said second dielectric substrate and aligned with said first conductive substrate;
    said second conductive substrate having an aperture therethrough, said aperture aligned with said first conductive substrate.

5. The electromagnetic structure according to claim 4, wherein said second dielectric substrate comprises a thermoplastic elastomer with a loss tangent (tan δ) of less than about 0.2.

6. The electromagnetic structure according to claim 5, wherein said second dielectric layer further comprises a sufficient, non-zero amount of a filler to provide a predetermined dielectric constant from about 1 to about 50 in the second dielectric layer, said dielectric constant of the second dielectric layer having a lower value than the dielectric constant of said first dielectric layer.

7. The electromagnetic structure according to claim 1, wherein said first dielectric layer further comprises a polymeric filler.

8. The electromagnetic structure according to claim 1, wherein the thermoplastic elastomer comprises:
 a thermoplastic polymeric component selected from the group consisting of polypropylene, polyethylene, and copolymers of ethylene and propylene; and
 an elastomeric component selected from the group consisting of butyl rubber, natural rubber, ethylene-propylene rubber (EPR), ethylene-propylene diene rubber (EPDM) and silicone rubber.

9. The electromagnetic structure according to claim 8, wherein the thermoplastic component is polypropylene and the elastomeric component is crosslinked or uncrosslinked EPDM.

10. The electromagnetic structure according to claim 1, wherein said first conductive substrate is patterned in an array of microstrip patches and wherein said second conductive layer has a plurality of apertures therethrough, each of said apertures aligned with a corresponding microstrip patch from said array of microstrip patches.

11. An electromagnetic structure according to claim 1, wherein the loss tangent (tan δ) of the thermoplastic elastomer is less than about 0.005.

12. An electromagnetic structure comprising:
 a first conductive substrate having a first side and a second side;
 a first dielectric substrate having a first side and a second side, said second side of said first conductive substrate adjacent said first side of said first dielectric substrate, said first dielectric substrate consisting essentially of a thermoplastic elastomer with a loss tangent (tan □) of less than about 0.2 and about 5% to about 60% by volume of thermoplastic elastomer of a dielectric filler selected from the group consisting of undoped ceramics, doped ceramics and mixtures thereof to provide a dielectric constant of about 1 to about 50 in the dielectric substrate; and
 feeding means for feeding said first conductive layer.

13. The electromagnetic structure according to claim 12, wherein said first conductive substrate has a slot therethrough.

14. The electromagnetic structure according to claim 13, wherein said feeding means comprises:
 a second dielectric substrate having first and second faces, said first face of said second dielectric substrate adjacent said first side of said first conductive substrate; and
 a microstrip transmission line having first and second faces, said first face of said transmission line adjacent said second face of said second dielectric substrate and perpendicularly aligned with said slot.

15. The electromagnetic structure according to claim 14, wherein said second dielectric substrate comprises a thermoplastic elastomer with a loss tangent (tan δ) of less than about 0.2.

16. The electromagnetic structure according to claim 15, wherein said second dielectric substrate fuirther comprises a sufficient non-zero amount of a filler to provide a predeterniined dielectric constant from about 1 to about 50, said dielectric constant having a lower value than the dielectric constant of said first dielectric substrate.

17. The electromagnetic structure according to claim 12, wherein said dielectric substrate further comprises a polymeric filler.

18. An electromagnetic structure according to claim 12, wherein the loss tangent (tan δ) of the thermoplastic elastomer is less than about 0.005.

19. An electronic display system for both visual and electromagnetic data communication, said system comprising:
 display means having visual information thereon;
 antenna means for electromagnetic communication, said antenna means comprising at least one dielectric substrate, said dielectric substrate consisting essentially of a thermoplastic elastomer with a loss tangent (tan □) of less than about 0.2 and a sufficient, non-zero amount of a dielectric filler selected from the group consisting of undoped ceramics, doped ceramics and mixtures thereof to provide a dielectric constant of about 1 to about 50 in the dielectric substrate; and
 coupling means for allowing coupling to said antenna means.

20. The electronic display system for both visual and electromagnetic data communication according to claim 19, wherein said display means further comprises retroreflective sheeting having first and second faces, wherein said dielectric substrate has first and second faces, said first face of said dielectric substrate adjacent said second face of said retroreflective sheeting and wherein said antenna means further comprises:
 radiating means disposed between said second face of said retroreflective sheeting and said first face of said dielectric substrate for radiating electromagnetic energy; and
 a generally planar electrically conductive member having a first face and a second face for acting as a ground plane for said radiating means, said first face of said electrically conductive member being adjacent said second face of said dielectric substrate.

21. The electronic displaay system for both visual and electromagnetic data communication according to claim 19, wherein said antenna means comprises a first conductive substrate with a first side and a second side, and a first side of the dielectric substrate is adjacent the second side of the first conductive substrate, and a second side of the dielectric substrate is adjacent a first side of a second conductive layer, and wherein said coupling means comprises:
 a second dielectric substrate having first and second faces, said first face of said second dielectric substrate adjacent a second side of said second conductive layer; and
 a microstrip transmission line having first and second faces, said first face of said transmission line adjacent said second face of said second dielectric substrate and aligned with said first conductive substrate;
 said second conductive substrate having an aperture therethrough, said aperture aligned with said first conductive substrate.

22. The electronic display system according to claim 19, wherein the thermoplastic elastomer comprises:
 a thermoplastic polymeric component selected from the group consisting of polypropylene, polyethylene, and copolymers of ethylene and propylene; and
 an elastomeric component selected from the group consisting of butyl rubber, natural rubber, ethylene-propylene rubber (EPR), ethylene-propylene diene rubber (EPDM) and silicone rubber.

23. The electronic display system according to claim 22, wherein the thermoplastic component is polypropylene and the elastomeric component is crosslinked or uncrosslinked EPDM.

24. An electronic display system according to claim 19, wherein the loss tangent (tan δ) of the thermoplastic elastomer is less than about 0.005.

* * * * *

UNITED STATES PATENT AND TRADEMARK OFFICE
CERTIFICATE OF CORRECTION

PATENT NO.: 5,844,523

DATED: December 1, 1998

INVENTOR(S): Joan V. Brennan, Scott T. Ginkel, and Timothy S. Skogland

It is certified that error appears in the above-identified patent and that said Letters Patent is hereby corrected as shown below:

Col. 16, line 26, "from the group, consisting" should read --from the group consisting--.

Col. 17, line 29, "tangent (tan □) of" should read --tangent (tan $\delta$) of--.

Col. 17, line 54, "substrate fuirther comprises" should read --substrate further comprises--.

Col. 17, line 55, "sufficient non-zero" should read --sufficient, non-zero--.

Col. 17, line 55 and 56, "a predeterniined dielectric" should read --a predetermined dielectric--.

Col. 18, line 16, "retrorefiective" should read --retroreflective--.

Col. 18, line 19 and 20, "said retrorefiective sheeting" should read --said retroreflective sheeting--.

Col. 18, line 31, "electronic displaay system" should read --electronic display system--.

Signed and Sealed this

Ninth Day of May, 2000

Attest:

Q. TODD DICKINSON

*Attesting Officer*

*Director of Patents and Trademarks*

UNITED STATES PATENT AND TRADEMARK OFFICE
CERTIFICATE OF CORRECTION

PATENT NO.: 5,844,523

DATED: December 1, 1998

INVENTOR(S): Joan V. Brennan, Scott T. Ginkel, and Timothy S. Skogland

It is certified that error appears in the above-identified patent and that said Letters Patent is hereby corrected as shown below:

Col. 16, line 24, "tangent (tan □) of less than" should read --tangent (tan δ) of less than--.

Col. 17, line 29, "tangent (tan □) of" should read --tangent (tan δ) of--.

Col. 18, line 5, "tangent (tan □)" should read --tangent (tan δ)--.

Signed and Sealed this

Fourteenth Day of November, 2000

Attest:

Q. TODD DICKINSON

Attesting Officer

Director of Patents and Trademarks